United States Patent [19]

La Rosa et al.

[11] Patent Number: 4,870,312

[45] Date of Patent: Sep. 26, 1989

[54] SURFACE WAVE DEVICE HAVING ANTI-REFLECTIVE SHIELD

[75] Inventors: Richard La Rosa, South Hempstead; Thomas J. Marynowski, Huntington, both of N.Y.

[73] Assignee: Hazeltine Corporation, Greenlawn, N.Y.

[21] Appl. No.: 16,613

[22] Filed: Feb. 19, 1987

[51] Int. Cl.4 .......................... H03H 9/00; H03H 9/42
[52] U.S. Cl. .............................. 310/313 B; 310/313 C; 310/313 D; 333/151; 333/154
[58] Field of Search ............... 333/151, 153, 150, 194, 333/154, 193, 195; 310/313 R, 313 B, 313 C, 313 D

[56] References Cited

U.S. PATENT DOCUMENTS

| | | | |
|---|---|---|---|
| 4,146,851 | 3/1979 | Dempsey et al. | 333/153 X |
| 4,201,964 | 5/1980 | Noro et al. | 333/154 X |
| 4,205,280 | 5/1980 | Gilchrist et al. | 333/151 |
| 4,333,065 | 6/1982 | DeVries | 333/151 X |
| 4,365,219 | 12/1982 | Nathan | 333/193 |
| 4,406,964 | 9/1983 | Chiba et al. | 333/194 X |
| 4,420,728 | 12/1983 | Bower | 333/151 |
| 4,516,094 | 5/1985 | Lee | 333/151 X |
| 4,535,265 | 8/1985 | Kodama et al. | 333/154 X |
| 4,604,623 | 5/1986 | Skeie | 333/151 X |
| 4,642,506 | 2/1987 | Lewis | 310/313 D |
| 4,642,507 | 2/1987 | Suthers et al. | 333/151 X |

FOREIGN PATENT DOCUMENTS

| | | | |
|---|---|---|---|
| 2235233 | 1/1974 | Fed. Rep. of Germany | 333/194 |
| 0028840 | 3/1977 | Japan | 333/150 |
| 0069359 | 6/1979 | Japan | 333/150 |
| 74230 | 6/1980 | Japan | 333/194 |
| 191513 | 11/1983 | Japan | 333/195 |
| 43912 | 3/1985 | Japan | 333/195 |
| 364075 | 11/1973 | U.S.S.R. | 333/153 |

Primary Examiner—Eugene R. Laroche
Assistant Examiner—Benny Lee
Attorney, Agent, or Firm—Edward A. Onders

[57] ABSTRACT

A surface wave acoustic delay line is formed of a set of electrode assemblies disposed on the surface of a block of crystalline material propagative of a surface acoustic wave. In each of the assemblies, the electrodes are arranged in an interdigitated pattern. Reflected waves are cancelled by the construction of an additional electrode in each of an electrode assembly, the additional electrode extending only one-half the distance of the other electrodes and being spaced from an adjacent electrode by one-quarter wavelength. This introduces a 180° phase shift between portions of relected waves which then cancel to remove the reflection. Also, in the case of closely spaced electrode assemblies, additional electrodes, equal in shape and size to the electrodes of the assemblies, are introduced between the assemblies in the form of a grid which propagates surface waves without reflection.

9 Claims, 3 Drawing Sheets

SURFACE WAVE DEVICE HAVING ANTI-REFLECTIVE SHIELD

BACKGROUND OF THE INVENTION

1. Field of the Invention

This invention relates to surface acoustic wave delay lines having a series of tap transducers which may be selected to impart a desired delay to a signal propagating along the delay line and, more particularly, to the inclusion of additional electrodes interspersed among the foregoing series of transducers to prevent the generation of reflected waves which degrade signal quality.

2. Description of the Prior Art

Surface acoustic wave (SAW) delay lines are widely used in signal processing operations. Typically, such delay lines are composed of a crystalline material which undergoes mechanical strain in response to an impressed electric field. The delay lines are constructed with a series of paired electrodes in contact with a surface of the crystalline material, wherein each paired electrode in combination with the crystalline material may be regarded as a transducer for converting an electric field into an acoustic wave which travels along the delay line, and for converting energy of the acoustic wave back into electric energy. The primary mode of propagation of the acoustic energy is in the form of a surface wave which travels along the surface to which the electrodes are appended. The acoustic wave travels at a predetermined speed between electrodes of a transmitting transducer to electrodes of a receiving transducer, the surface wave imparting a delay to the propagation of signals between the transmitting and receiving transducers dependent on the distance between the transmitting and the receiving transducers.

In the case where only one transmitting transducer and only one receiving transducer are employed, the SAW delay line serves the function of providing a fixed delay. However, delay lines are frequently built with additional electrode structures arranged serially along the delay line to permit a user of the line to select any one of many possible amounts of delay by connection of external electric circuitry to any desired pair, or taps, of the transducers. Such a delay line provides the function of a variable delay. A multiply-tapped delay line can also be employed as a transversal filter in which a signal enters the delay line via a transducer at one end thereof, and is extracted as a set of signal replicas from each of a set of taps whereby the signal replicas have different delays. As is well known, each of the delayed replicas is multiplied by a suitable scaling factor whereupon the signal replicas are summed together to form an output signal of the transversal filter.

A problem arises in the case of delay lines having a series of tap transducers for producing the function of adjustable delay, or the function of a transversal filter, due to the reflection of surface waves from electrodes disposed on the surface of the crystalline material. Such reflections result in the generation of waves propagating in both directions throughout the crystal and the extraction of an output signal at a selected output transducer, wherein the output signal is degraded by the presence of unwanted signal components produced by the foregoing reflections. Various techniques have been employed to solve the problem, such as the use of absorbant material, grounding of unused electrodes, and encasing the delay line in a metal case. However, these techniques by themselves have not been fully successful because they fail to address a fundamental problem, namely, the generation of the reflections at the individual electrodes due to discontinuity of the transmission medium.

SUMMARY OF THE INVENTION

The foregoing problem is overcome and other advantages are provided by a SAW delay line having a serial arrangement of electrodes suitable for use as a variable delay line and as a transversal filter and wherein, in accordance with the invention, additional electrode structures are interspersed among the foregoing electrodes to inhibit the generation of reflected waves. It is, therefore, a major object of the invention to inhibit the generation of reflected waves or cancel their effects in signals outputted from the delay line so that spurious responses associated with such wave reflections are negligibly small.

In the peferred embodiment of the invention, provision is made for both fine and coarse increments of delay. This is accomplished by dividing the delay line into a course section and a fine section. In the coarse section, the tap transducers are spaced apart at a relatively large distance while, in the fine section, the tap transducers are spaced apart by a relatively small distance. For a simple adjustable delay line, one of the coarse-spaced transducers is selected as the input transducer, and the other transducers in that section are grounded. One of the fine-spaced transducers is selected as output and the other transducers in the fine section are grounded. The device is reciprocal, so input and output can be interchanged as long as the circuit provides the proper impedance termination for each selected transducer. In the fine section, additional electrodes are inserted between the tapped electrodes to form a grating of equally spaced electrodes, the spacing being at approximately one-quarter wavelength of the acoustic wave. The grating presents the appearance of a uniform periodic structure suitable for the transport of an acoustic wave with the result that, essentially, no spurious waves are generated by the interaction of a traveling acoustic wave with the electrode structure.

In the coarse section, the large distances between the tapped electrodes creates a situation in which it is impractical to insert a fine grating and, furthermore, such grating might well introduce unwanted attenuation to the acoustic wave. In accordance with a further feature of the invention, effects of reflections are inhibited by the introduction of electrodes which extend only part way, preferably halfway, across the delay line and spaced one-quarter wavelength from the tapped electrode structure of a transducer. In each transducer, one such electrode is positioned on both sides of the transducer. This results in the reflection of waves from the reduced-length electrode and from the adjacent full-length electrode, which waves are out of phase with each other by 180° resulting in nondetection of a wave which would otherwise have been reflected from the transducer. Also, at the ends of the crystalline material, both the end in the coarse section and the end in the fine section, acoustically absorbant material is disposed on the crystalline material to absorb waves which might otherwise reflect off of the end surfaces of the crystalline material.

It is the practice to separate input and output portions of the delay line by a shield which is constructed, preferably, as a metal overlay on the surface of the crystalline material, the shield inhibiting any cross coupling of electromagnetic waves between input and output terminals of the delay line. Such shield can also be a source of reflected waves, in accordance with a further feature of the invention, both sides of the shield are structured with a step having a width of one-quarter wavelength of the acoustic wave. The step is located approximately midway between both sides of the delay line. A wave which reflects off of the step portion and off of the unstepped portion of a side of the shield produces two wavelets which are 180° out of phase so as to cancel effects of any reflected wave which might otherwise be produced from the side of the shield. In the construction of the delay line, it is preferable to encase the delay line within a metallic case connected to the shield for grounding the shield. This confines the field of each transducer to reduce coupling between transducers and also shields the delay line from external circuitry. The foregoing structure of the invention provides the desired result of inhibiting the generation of spurious responses to signals outputted by the delay line, this being accomplished by inhibiting the generation of reflected waves from the electrodes and the shield of the delay line.

BRIEF DESCRIPTION OF THE DRAWINGS

The aforementioned aspects and other features of the invention are explained in the following description, taken in connection with the accompanying drawing wherein.

DETAILED DESCRIPTION OF THE INVENTION

Figure 1:
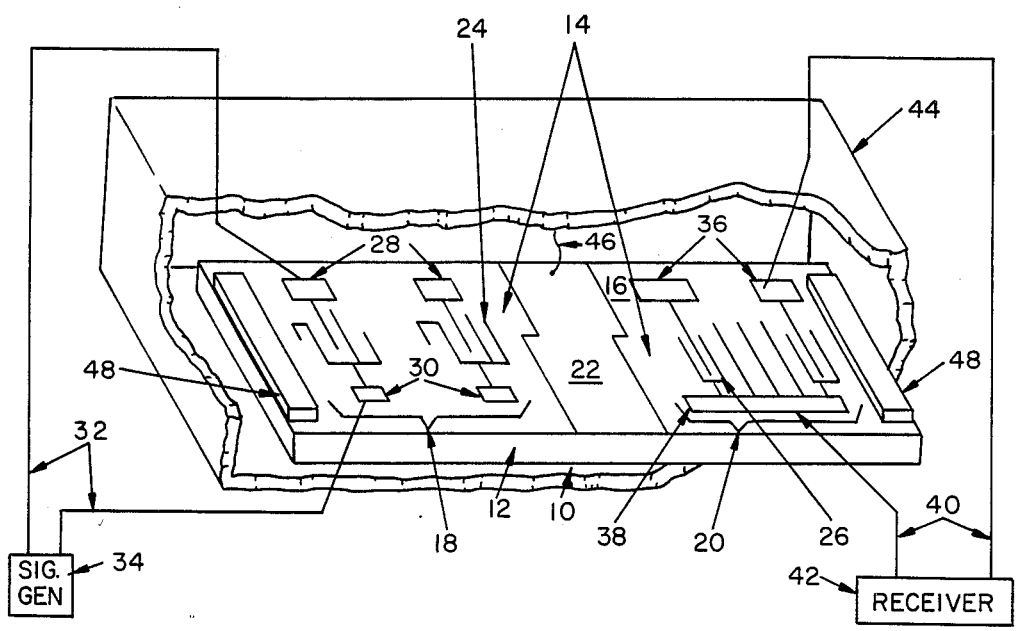
FIG. 1 is a stylized view of a delay line incorporating the invention, the delay line being enclosed within a metallic case and coupled to external circuitry.

FIG. 1 shows a delay line 10 constructed in accordance with the invention and being formed of a flat block 12 of crystalline material which serves as a base for supporting an array 14 of electrodes disposed on a top flat surface 16 of the block 12. The array 14 comprises a coarse section 18 and a fine section 20 which are separated by a shield 22. In the coarse section 18, the array 14 comprises electrode assemblies 24 spaced apart by relatively large distances. In the fine section 20, the array 14 comprises electrode assemblies 26 which are spaced apart by relatively small distances.

Each of the electrode assemblies 24 is provided with a pair of pads 28 and 30. Electric wires 32 are secured to pads 28 and 30 of one of the transducers to provide connection with external circuitry such as a signal generator 34. All remaining transducers are short circuited by means of their respective pads 28 and 30. The electrode assemblies 26 are each provided with a pad 36 and share a common pad 38 upon which electric wires 40 may be affixed to provide connection with external circuitry such as a receiver 42. Preferably, all pads except one are grounded, i.e. one of the pads 36 is connected to receiver 42 and all other pads 36 as well as pad 38 are grounded. The delay line 10 is enclosed within a metallic case 44 (shown partially cutaway) which shields external circuitry from electromagnetic waves which may be radiated from the electrodes of the array 14. The shield 22 is connected by a wire 46 to the case 44 to enhance electromagnetic isolation between the generator 34 and the receiver 42. Absorbers 48 of acoustic wave energy are disposed on opposite ends of the block 12.

The amount of delay imparted by the delay line 10 to signals traveling via the line 10 between the generator 34 and the receiver 42 is dependent on the choice of electrode assemblies 24 and 26 to which the generator 34 and the receiver 42 have been connected. If the selected assemblies are far apart, the delay is relatively large while, if the selected assemblies are close together, the delay is relatively small.

Figure 2:
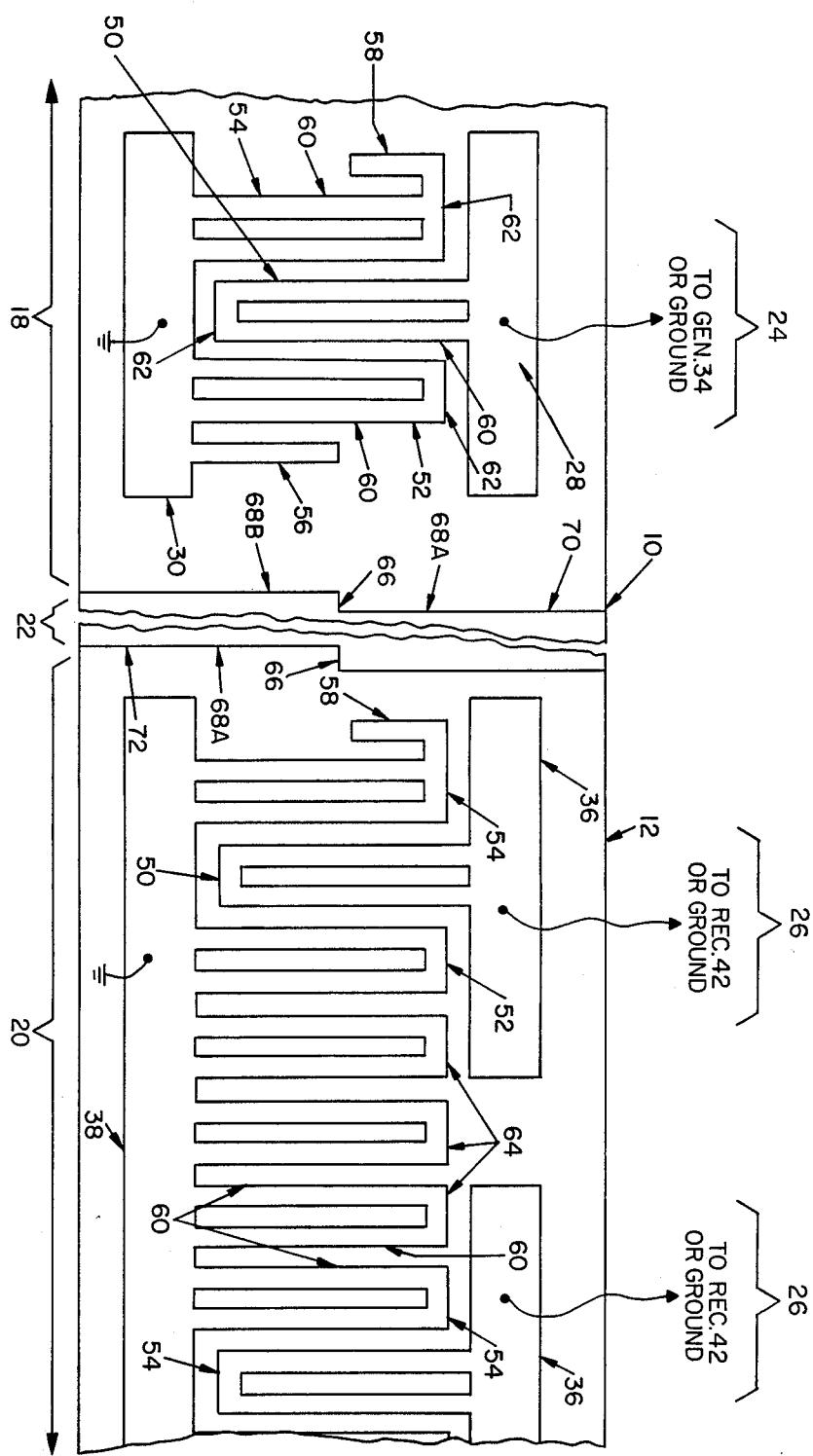
FIG. 2 is a plan view of a fragmentary central portion of the delay line of FIG. 1, the scale of the drawing being enlarged in the horizontal direction relative to the scale in the vertical direction, so as to more readily show characteristics of the electrode structure of the delay line.

FIG. 2 shows an enlarged view of a central portion of the delay line 10, the central portion including the shield 22, an electrode assembly 24 of the coarse section 18, and a plurality of electrode assemblies 26 of the fine section 20 of the array 14. Each of the electrode assemblies 24 of FIG. 1 has the same construction, this construction being shown in detail in FIG. 2. The assembly 24 comprises a set of interdigitated electrodes wherein electrodes attached to one pad are interleaved with electrodes attached to the opposite pad. In each assembly 24, there is a set of electrodes including an electrode 50 extending transversely of the block 12 from a central portion of the pad 28, an electrode 52 extending from the pad 30 parallel to the electrode 50 along the right side thereof, an electrode 54 extending from the pad 30 parallel to the electrode 50 and along the left side thereof, an electrode 56 extending from the pad 30 to a length which is one-half the length of the electrode 52 along the right side of the electrode 52, and an electrode 58 extending from an outer terminus of the electrode 54 back towards the pad 30 along the left side of the electrode 54 to a distance of one-half the length of the electrode 54. Each of the electrodes, 50, 52, and 54 is referred to as a split-finger electrode because each is formed as a pair of electrically conductive members 60 spaced apart from each other and disposed parallel to each other. Preferably, the outboard ends of the pairs of the members 60 in each of the electrodes 50, 52, and 54 are joined together by shorting strips 62. In the construction of the preferred embodiment of the invention, the block 12 is composed of lithium niobate, which material is ferroelectric. This material is polarized by a well-known process in which the material is heated to the Curie temperature and placed in a polarizing electric field. Each of the electrodes and the pads of the electrode assembly 24 are fabricated of a low density metal such as aluminum. Aluminum is also used in fabricating the electrodes and pads of each of the fine electrode assemblies 26.

Each of the assemblies 26 is constructed with the same shape, the construction of an assembly 26 being shown in detail in FIG. 2. Each of the assemblies 26 includes the three electrodes, 50, 52, and 54 described with reference to the assembly 24. There could be more electrodes or as few as two. The number of electrodes depends on the fractional bandwidth. In addition, either a short electrode 56 or a short electrode 58 is disposed alongside the assembly 26 nearest to the shield 22. By way of example, an electrode 58 is shown in FIG. 2 appended to the electrode 54 of the assembly 26 nearest to the shield 22. Also included within the fine section 20 are sets of electrodes 64 which are positioned uniformly between the electrode 52 and 54 adjacent ones of the electrode assemblies 26. By way of example, three such electrodes 64 are shown in FIG. 2, it being understood that many more of the electrodes 64 may be so positioned between successive ones of the assemblies 26, the number of electrodes 64 depending on the spacing between successive ones of the assemblies 26. In the illustration each of the electrodes 64 has the same structure as do the electrodes 52 and 54. Since all electrodes 64 are at the same potential, they may all be connected together at their outboard ends by shorting strips 62. This reduces the path length for circulating currents and reduces the propagation loss of the acoustic waves. These jumpers also provide an alternate connection which is useful if an electrode is interrupted by a scratch or other defect. Also half of a split electrode may be left out and the spacing may be deviated slightly to approximate a uniform grating in those cases where an integral number of full electrodes will not fit between taps.

The electrode 64 constitutes an important feature of the invention because its presence inhibits the generation of surface acoustic waves which would be reflected from the electrodes 52 and 54 of each of the assemblies 24 and 26 if electrode 64 was not present. Similarly, electrodes 56 and 58 constitute an important feature of the invention because their presence produces reflected waves which cancel the effects of surface acoustic waves which would be reflected from the electrodes 52 and 54 of each of the assemblies 24 and 26 if electrodes 56 and 58 were not present.

In the construction of the assemblies 24 and 26, the members 60 of the respective electrodes are spaced apart from each other, on centers, by a distance of one-quarter wavelength of the surface acoustic wave generated within the block 12 upon application of an alternating electric field between the pads of any one of the assemblies 24 and 26. Each of the members 60 has a width of one-eighth of the foregoing wavelength, and a length which is many wavelengths long, the length of each member 60 being sufficiently long to produce the well known radiation pattern of a uniformly illuminated broadside radiator.

In accordance with the invention, the electrode 58 on each of the assemblies 30 acts to reflect a portion of an externally originating acoustic wave incident upon the assembly 24, 26 from the left side, as viewed in FIG. 2, resulting in a reflected wave propagating towards the left. Similarly, electrode 58 acts to reflect a portion of an internally originating acoustic wave incident upon electrode 58 and adjacent member 60 from the right side resulting in a reflected wave propagating toward the right. Since the electrode 58 extends only half way along the adjacent member 60 of the electrode 54, the remaining portion of the member 60 is also exposed to the foregoing acoustic wave incident upon the member 60. The exposed portion of the member 60 also reflects a portion of the acoustic wave in the same fashion as does the electrode 58. As a result, two reflected waves are launched together, one of the acoustic waves being launched from the electrode 58 and the other acoustic wave being launched from the exposed portion of the member 60. Since the electrode 58 and the member 60 are spaced apart by one-quarter of the acoustic wavelength, the incident wave from the left impinges upon the member 60 subsequent to the impingement of the wave upon the electrode 58. Also, there is a delay in the reflected waves because the wave reflected from the member 60 must travel an additional quarter wavelength before reaching the site of the electrode 58. As a result, the two reflected waves are out of phase with each other by 180°. Internal incident waves from the right impinge upon electrode 58 subsequent to the impingement of the wave upon the member 60. Waves reflected from electrode 58 is delayed because it must travel an additional quarter wavelength before reaching member 60. As these two reflected waves propagate, they induce opposite charges on any electrode which extends across the entire acoustic path, and hence do not couple to full length electrodes. Thereby, the electrode 58 and the exposed portion of the member 60 have cooperated, in accordance with the invention, to prevent the detection of a reflected wave. The same applies to the reflection from the electrodes 56 and 60 for a wave incident from the right.

The foregoing discussion applies also to the electrode 56 on the right side of the assembly 24 and the corresponding exposed portion of the adjacent member 60 of the electrode 52 in each of the assemblies 24. As shown in FIG. 2, the geometric relationship between the electrode 56 and the exposed portion of the adjacent member 60 is the same as that described for the electrode 58 and the exposed portion of the adjacent member 60. Therefore, an acoustic wave incident upon the assembly 24 from the right or left would be reflected in part from the electrode 56, and partly from the adjacent member 60 resulting in cancellation of a resultant reflected wave from the assembly 24. Therefore, with reference to all of the electrode assemblies 24 of the coarse section 18, an acoustic wave may be generated by an assembly 24, or may be received by an assembly 24, but the reflections from assembly 24 will not be detected.

As has been noted above, an electric field may be produced by a voltage applied between the pads 24 and 30 by connection to the signal generator 34. The presence of an electric field between the pads 24 and 30 induces a mechanical strain to the material of the block 12. The crystalline material of the block 12 may be either piezoelectric or ferroelectric, the ferroelectric material being employed in the preferred embodiment of the invention. Due to the connection of the electrode 50 to the pad 28, and due to the connections of the electrodes 52 and 54 to the pad 30, the electric field appears between the electrode 50 and the electrode 52, and also between the electrode 50 and the electrode 54. The interaction between the electric field and the crystalline material provides for the conversion of electric energy to acoustic energy whereby an electrode assembly 24 may be viewed as a transducer for converting electrical energy to acoustic energy. The foregoing energy conversions is reciprocal in that an acoustic wave may be coupled to the electrode structure for the extraction of energy of the acoustic wave, as is accomplished by connection of the receiver 42 to the pads of an electrode assembly. The electrode assemblies 26 can also function as transducers in the same manner as do the electrode assemblies 24.

The foregoing geometry of the electrodes 56 or 58 alongside an adjacent electrode member 60 is also carried forth by the interface between the block 12 of crystalline material and each edge of the shield 22 to prevent reflections from the interfaces with the shield 22. This is accomplished by constructing the edge of the shield 22 with a step 66 which extends for a distance of one-quarter wavelength in a direction parallel to the longitudinal axis of the block 12. The step 66 is located halfway between the sides of the delay line 10 so as to permit equal reflection from the half-edge portions 68A and 68B of the edges 70 and 72 of the shield 22. Due to the quarter wavelength extent of each step 66, portions of a wave reflected from the half-edge portions 68A and 68B are 180 degrees out of phase with each other and result in a cancellation of a reflected wave. Thus, the stepped configuration of the edge 70 and of the edge 72 prevent the detection of reflected of waves from edges 70 and 72.

In accordance with a further feature of the invention, the relatively close spacing of the electrode assemblies 26 of the fine section 20 permits the construction of a continuous grid of split finger electrodes comprising the electrodes 50, 52, 54, and 64. Such a continuous grid is provided by the arrangement of the foregoing electrodes shown in FIG. 2. Therein, all of the electrodes have approximately the same width, as measured along the longitudinal axis of the block 12, and all of the electrodes have approximately the same interelectrode spacing as measured along the longitudinal axis of the block 12. The approximately uniform grid pattern of the elctrodes with members 60 of the electrodes being spaced apart by one-quarter wavelenth provides an approximately uniform periodic structure which supports the propagation of a surface wave without reflection. One of the members 60 of a split dummy electrode may be omitted to better approximate the quarter wavelength spacing. While the electrodes 64 may be regarded as dummy electrodes in the sense that they do not participate in the action of a transducer associated with any of the assemblies 26, nevertheless, the electrodes 64 participate equally with the electrodes 50, 52 and 54 of each of the assemblies 26 in the construction of the periodic grating structure. A discontinuity exists at the end of the grating structure facing the edge 72 of the shield 22, which discontinuity can give rise to a reflection of a wave incident from the left. Accordingly, to prevent such reflection of waves from the discontinuity, the electrode 58 has been placed at the end of the grid structure by connection of the short electrode 58 to an outboard end of the electrode 54. Alternatively, a short electrode 56 could be connected to the pad 38 in lieu of the use of the electrode 58. With either the electrode 58 or the electrode 56, there is provided the cancellation of a reflected wave from the left end of the grid structure by the mechanism described previously with reference to the assembly 24 of FIG. 2. Shorting strips 62 also may be connected between dummy electrodes 64 to reduce resistance to circulating currents. This reduces the SAW propagation loss.

It is also noted that the invention is operative with or without the shorting strips 62. However, the shorting strip 62 is employed advisedly in the construction of the invention so as to insure electrical connection of at least a part of a member 60 to its pad in the event of a fracture of a strip of metal from which the member 60 is formed, which fracture might result from rough handling of the delay line 10. Shorting strips 62 may also be connected between dummy electrodes 64 to reduce resistance to circulating currents. This reduces the SAW propagation loss.

In the construction of the preferred embodiment, the lithium niobate crystal is cut at an angle of 128°. The propagation delay between successive ones of the fine electrode assemblies 26 is 25 ns (nanoseconds). The propagation delay between successive ones of the coarse electrode assemblies 24 is 162.5 ns. The length of the delay line 10 can be selected to provide delays in the range of approximately 1.3 to 5.3 microseconds with fixed delay increments of 25 ns. In the event that a desired delay between the fine electrode assemblies 26 is a nonintegral number of quarter wavelengths, a slight variation in spacing between one or more of the electrodes 64 should be possible to accommodate the desired delay without the introduction of any more than a negligibly small perturbation of the grid structure, in which case no significant reflected wave should result. It is also noted that while dummy electrodes 64 could be employed also in the coarse section 18, the relatively large spacing between the assemblies 24 would necessitate so many of the dummy electrodes 64 that excessive attenuation of signal strength would be expected. Accordingly, the dummy electrodes 64 have not been used in the coarse section 18 in the preferred embodiment of the invention. Spurious signal response due to unwanted reflections should be less than approximately 40 dB (decibels) below the main delayed signal level. A typical thickness for the block 12 is 50 mils. The overall length of the block 12 is on the order of one inch and the electrodes of the assemblies 24 and 26 are on the order of one-quarter inch in length. The structure or the electrodes may be fabricated by well-known photolithographic techniques wherein the aluminum electrodes can be produced by vacuum evaporation or sputtering. The aluminum is deposited to a thickness of approximately 2000 angstroms, which thickness is much smaller than a wavelength of the acoustic wave. Typical frequencies of the acoustic wave may be in the range of 40 to 160 megahertz. A typical value of the relationship between travel distance and propagation delay of the wave is approximately one-eighth inch per microsecond.

In the construction of the preferred embodiment of the invention, the absorbers 48 may be fabricated of lossy material such as glue or silicon rubber which is secured adhesively to the surface of the block 12. The lossy material employed in the absorber absorbs energy from the acoustic wave so as to inhibit reflection of the wave from the end of the block 12. The width of the shield 22 is typically on the order of one-quarter inch. At high frequencies, such as those employed by the surface acoustic wave, the effect of capacitance of the electrodes of the assemblies 24 and 26 is sufficient to provide significant coupling between input and output terminals of the delay line 10, which coupling is suppressed by the shield 22.

In the operation of a delay line such as that shown in FIG. 1, a signal introduced at any one of the tranducers propagates in both directions therefrom. In the absence of the invention, the numerous electrodes would introduce discontinuities to the surface upon which the waves propagate resulting in a large family of reflected waves propagating in both directions. By virtue of the invention, reflected waves are made to cancel so that a substantially pure signal produced by a generator, such as the generator 34, is received at a receiver, such as the receiver 42. Thereby, the invention has enabled the fabrication of a delay line having both coarse and fine increments of selectable delay, and wherein the delay can be provided without signal degradation due to unwanted reflections.

Figure 3:
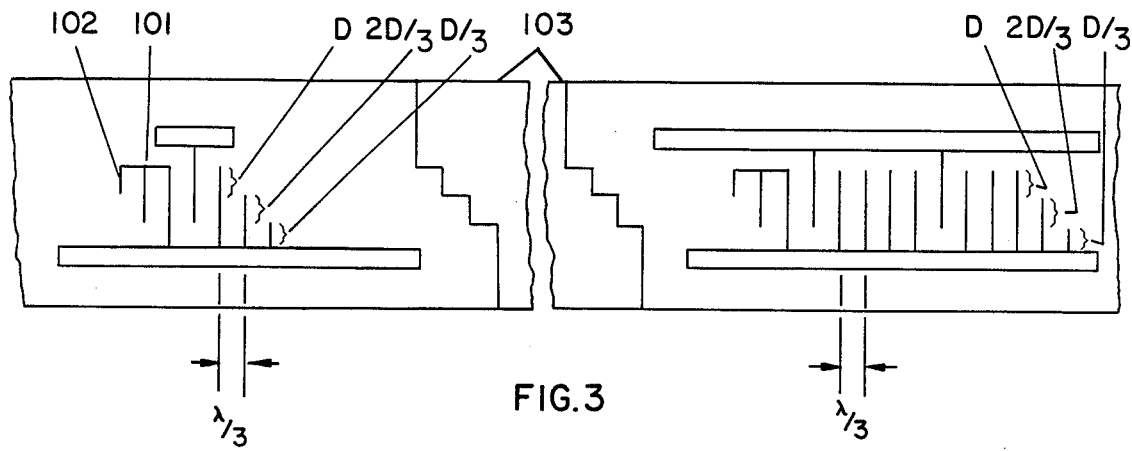
FIG. 3 illustrates an embodiment of the invention with approximately one-third wavelength spacing.
Figure 4:
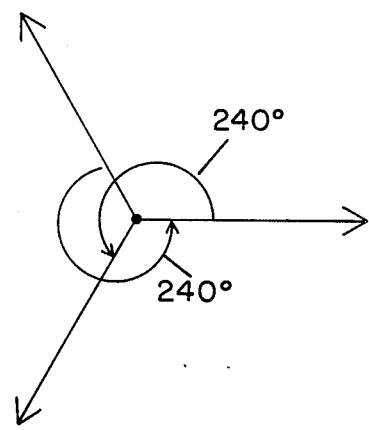
FIG. 4 is a vector diagram useful in describing the operation of the embodiment of FIG. 3.

FIG. 3 illustrates an embodiment of the invention with approximately one-third wavelength spacing. The end of the grating uses two short electrodes. Electrode 101 is two-thirds of "the maximum electrode length 'D'" in length and electrode 102 is one-third D in length. This results in the formation of three reflected waves which are 240° apart from each other. As a result, the vector sum of the three waves is zero as illustrated in FIG. 4. Shield 103 employs two steps, each step of 120°, to complement this configuration. This configuration would be useful at high center frequencies where one-quarter wavelength spacing is too fine.

In general, the invention can be implemented with complementary electrodes spaced apart wavelengths at multiples such as ⅛, ⅜, 5/4 ... The shield would then employ the necessary number of steps. As the spacing increases, the reflection cancellation bandwidth would decrease. However, this would still be adequate for many applications.

It is to be understood that the above described embodiment of the invention is illustrative only, and that modifications thereof may occur to those skilled in the art. Accordingly, this invention is not to be regarded as limited to the embodiment disclosed herein, but is to be limited only as defined by the appended claims.

What is claimed is:

1. A surface acoustic wave device, comprising:
a base of acoustic wave propogative material;
first transducer means, disposed on a surface of said base, for launching acoustic surface waves therein in response to an applied electrical signal;
second transducer means, also disposed on said surface of said base and spaced apart from said first transducer means, for receiving surface acoustic waves;
and means, disposed on said surface of said base between said first and second transducer means and having first and second edges facing said first and second transducer means, respectively, for providing shielding between said first and second means, said shielding means having two steps in each of said edges for inhibiting the generation of reflected surface acoustic waves, the length of each of said steps being ⅛ of a wavelength of an operating frequency of said device.

2. A surface acoustic wave device in accordance with claim 1 wherein the two steps in each edge are disposed on opposite sides of the midpoint of the edge.

3. A surface acoustic wave device, comprising:
a base of surface acoustic wave propogative material;
first transducer means, disposed on a surface of said base and having at least two substantially parallel electrodes of selected length less than or equal to a predetermined maximum length and one of which is grounded and located at an end of said first transducer means, for launching surface acoustic waves in a direction substantially perpendicular to said electrodes in response to an electrical signal applied between said pair of electrodes;
second transducer means, disposed on said surface of said base, for receiving surface acoustic waves;
and third means associated with said first transducer means, for suppressing surface acoustic waves in said device, said third means comprising at least one additional grounded electrode disposed on said surface of said base adjacent the grounded end electrode of said first transducer means and substantially parallel thereto and separated therefrom by a selected distance and having a selected length less than said grounded end electrode.

4. A surface acoustic wave device, comprising:
a base of surface acoustic wave propogative material;
first transducer means, disposed on a surface of said base, for launching surface acoustic waves;
second transducer means, disposed on said surface of said base and having at least two substantially parallel electrodes of selected length less than or equal to a predetermined maximum length and one of which is grounded and located at an end of said second transducer means, for receiving surface acoustic waves arriving from a direction substantially perpendicular to said electrodes;
and third means associated with said second transducer means, for suppressing surface acoustic waves in said device, said third means comprising at least one additional grounded electrode disposed on said surface of said base adjacent the grounded end electrode of said second transducer means and substantially parallel thereto and separated therefrom by a selected distance and having a selected length less than said grounded end electrode.

5. A surface acoustic wave device, comprising:
a base of acoustic wave propogative material;
first transducer means, disposed on a surface of said base and having at least three substantially parallel electrodes, each electrode having a selected length less than or equal to a predetermined maximum length, and including a grounded electrode at each end thereof, for launching acoustic surface waves in a direction substantially perpendicular to said electrodes in response to an electrical signal applied between predetermined ones of said electrodes;
second transducer means, disposed on said surface of said base and having at least three substantially parallel electrodes, each electrode having a selected length less than or equal to said predetermined maximum length, and including a grounded electrode at each end thereof, for receiving acoustic surface waves arriving from a direction substantially perpendicular to said electrodes;
and third means associated with said first and said second transducer means, for suppressing surface acoustic waves in said device, said third means comprising at least four pair of grounded electrodes, each pair being disposed adjacent a corresponding one of the grounded end electrodes of said first and second transducer means, said grounded end electrodes being said maximum length, the one of said pair that is closest to said grounded end electrode being ⅔ said maximum length and the other of said pair being ⅓ said maximum length.

6. A surface acoustic wave device, comprising:
a base of surface acoustic wave propogative material;
first transducer means, disposed on a surface of said base and having at least three substantially parallel electrodes, each electrode having a selected length less than or equal to a predetermined maximum length, and including a grounded electrode at each end thereof, for launching surface acoustic waves in a direction substantially perpendicular to said electrodes in response to an electrical signal applied between predetermined ones of said electrodes;
second transducer means, disposed on said surface of said base, for receiving surface acoustic waves;

and third means associated with said first transducer means, for suppressing surface acoustic waves in said device, said third means comprising at least two grounded electrodes disposed on said surface of said base, each of which is disposed adjacent a corresponding one of the grounded end electrodes of said first transducer means and substantially parallel thereto and separated therefrom by a selected distance and having a selected length less than the length of said corresponding grounded end electrode of said first transducer means.

7. A surface acoustic wave device in accordance with claim 6 wherein said third means includes at least two pair of grounded electrodes, each pair being disposed adjacent a corresponding one of the grounded end electrodes of said first transducer means, said grounded end electrodes being said maximum length, the one of said pair of electrodes that is closest to said grounded end electrode being ⅔ said maximum length and the other of said pair being ⅓ said maximum length.

8. A surface acoustic wave device, comprising:
a base of surface acoustic wave propogative material;
first transducer means, disposed on a surface of said base, for launching surface acoustic waves;
second transducer means, disposed on said surface of said base and having at least three substantially parallel electrodes, each electrode having a selected length less than or equal to a predetermined maximum length, and including a grounded electrode at each end thereof, for receiving surface acoustic waves arriving from a direction substantially perpendicular to said electrodes;
and third means associated with said second transducer means, for suppressing surface acoustic waves in said device, said third means comprising at least two grounded electrodes disposed on said surface of said base, each of which is disposed adjacent a corresponding one of the grounded end electrodes of said second transducer means and substantially parallel thereto and separated therefrom by a selected distance and having a selected length less than the length of said corresponding grounded end electrode of said second transducer means.

9. A surface acoustic wave device in accordance with claim 8 wherein said third means includes at least two pair of grounded electrodes, each pair being disposed adjacent a corresponding one of the grounded end electrodes of said second transducer means, said grounded end electrodes being said maximum length, the one of said pair of electrodes that is closest to said grounded end electrode being ⅔ said maximum length and the other of said pair being ⅓ said maximum length.

* * * * *